United States Patent
Gupta et al.

[11] Patent Number: 6,083,569
[45] Date of Patent: *Jul. 4, 2000

[54] DISCHARGING A WAFER AFTER A PLASMA PROCESS FOR DIELECTRIC DEPOSITION

[75] Inventors: Anand Gupta; Majid K. Shahreza, both of San Jose, Calif.

[73] Assignee: Applied Materials, Inc., Santa Clara, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/738,407

[22] Filed: Oct. 25, 1996

[51] Int. Cl.[7] ............................. B05D 3/14; B05D 3/04; H01L 21/3105
[52] U.S. Cl. ...................... 427/535; 427/539; 427/563; 427/579; 438/788; 438/710; 216/67
[58] Field of Search .................... 427/574, 579, 427/563, 534, 535, 539, 348, 398.5, 569; 437/238; 156/643.1; 438/788, 789, 792, 793, 710, 771, 722, 723, 724, 725, DIG. 972, 913, 906; 216/67, 68, 69, 70, 71

[56] References Cited

U.S. PATENT DOCUMENTS

| | | | |
|---|---|---|---|
| 4,342,617 | 8/1982 | Fu et al. | 427/579 |
| 4,415,760 | 11/1983 | Madan | 427/579 |
| 4,579,609 | 4/1986 | Reif et al. | 427/534 |
| 4,599,243 | 7/1986 | Sachdev et al. | 427/534 |
| 4,626,473 | 12/1986 | Loh et al. | 427/488 |
| 4,684,535 | 8/1987 | Heinecke et al. | 427/491 |
| 4,837,113 | 6/1989 | Luttmer et al. | 427/572 |
| 4,877,641 | 10/1989 | Dory | 427/579 |
| 4,916,091 | 4/1990 | Freeman et al. | 427/562 |
| 5,000,113 | 3/1991 | Wang et al. | |
| 5,011,705 | 4/1991 | Tanaka | 427/534 |
| 5,098,865 | 3/1992 | Machado et al. | 437/238 |
| 5,102,496 | 4/1992 | Savas | 427/575 |
| 5,254,497 | 10/1993 | Liu | 437/231 |
| 5,272,979 | 12/1993 | Lewis et al. | 101/467 |
| 5,328,555 | 7/1994 | Gupta | 156/643.1 |
| 5,362,526 | 11/1994 | Wang et al. | |
| 5,380,566 | 1/1995 | Robertson et al. | 427/534 |
| 5,382,311 | 1/1995 | Ishikawa et al. | 156/345 |
| 5,935,662 | 8/1999 | Woolley et al. | 427/535 |
| 5,997,962 | 12/1999 | Ogasawara et al. | 427/535 |

OTHER PUBLICATIONS

*IBM Tech. Discl. Bull.;* "Pump/Purge Procedure Using NR Feedstock"; vol. 34, No. 11, Apr. 1992 (pp. 237–238).

*Primary Examiner*—Marianne Padgett
*Attorney, Agent, or Firm*—Thomason, Moser & Patterson

[57] ABSTRACT

A method and apparatus for neutralizing a wafer in a plasma reactor following a deposition process which charges the wafer and hinders removal of the wafer from the plasma reactor. The wafer is exposed to a plasma of a noble gas such as helium to energize the reaction zone. Then a sufficient amount of an inert electronegative gas such as oxygen to neutralize the wafer is introduced into the plasma reactor in the absence of RF power or other gases. The neutralized wafer is readily removed from the plasma chamber.

11 Claims, 3 Drawing Sheets

DISCHARGING A WAFER AFTER A PLASMA PROCESS FOR DIELECTRIC DEPOSITION

BACKGROUND OF THE INVENTION

1. Field of the Invention

The present invention relates to the fabrication of integrated circuits. More particularly, the invention relates to removal of processed silicon wafers from a plasma reactor.

2. Background of the Invention

One of the primary steps in the fabrication of modem semiconductor devices is the formation of a thin film on a semiconductor substrate by chemical reaction of gases. Such a deposition process is referred to as chemical vapor deposition or CVD. Conventional thermal CVD processes supply reactive gases to the substrate surface where heat-induced chemical reactions take place to produce a desired film. The high temperatures at which some thermal CVD processes operate can damage device structures having metal layers previously formed thereon.

Other CVD methods of depositing silicon oxide layers over metal layers at relatively low temperatures include plasma-enhanced CVD (PECVD) techniques such as described in U.S. Pat. No. 5,362,526. Plasma-enhanced CVD techniques promote excitation and/or disassociation of the reactant gases by the application of radio frequency (RF) energy to a reaction zone near the substrate surface, thereby creating a plasma of highly reactive species. The high reactivity of the released species reduces the energy required for a chemical reaction to take place, and thus lowers the required temperature for such PECVD processes.

Deposition of dielectric layers using PECVD methods typically leaves a negative charge on the silicon wafer. When the dielectric layer is the final layer to be deposited in a plasma chamber, the negative charge on the wafer binds the wafer to the susceptor or substrate support plate. Lifting of the wafer may require sufficient force to break the wafer and has resulted in a procedure which neutralizes the wafer. After deposition of the dielectric layer, an oxygen plasma has been used to purge the plasma chamber and generate sufficient positive species to neutralize the wafer. The method relies on a low energy plasma as a result of oxygen in the plasma and does not always produce sufficient positive species to neutralize the wafer.

There remains a need for a process for neutralizing charged wafers to assist in removal of the wafers from a plasma chamber. It is an object of this invention to provide such a method and an integrated apparatus for performing the method.

SUMMARY OF THE INVENTION

The present invention provides a method and apparatus for neutralizing a charged wafer in a plasma reactor to assist in removing the wafer from the reactor. According to a method of the present invention, a plasma of a noble gas energizes the plasma reactor after the wafer is charged. Then, in the absence of a plasma, the plasma reactor is purged with a sufficient amount of an inert electronegative gas, such as oxygen or nitrogen, to neutralize the wafer. The wafer can then be removed from the plasma reactor without risk of damaging or breaking the wafer. A commercially available substrate processing platform can be setup and programmed to perform the process of the invention after a plasma enhanced deposition of a layer which leaves a negative charge on the wafer.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings. The appended drawings illustrate typical embodiments of this invention and are not to be considered limiting of its scope, for the invention may admit to other equally effective embodiments.

For a further understanding of the present invention, reference should be made to the ensuing detailed description.

DESCRIPTION OF A PREFERRED EMBODIMENT

The present invention provides a method for removing a processed wafer from a plasma reactor, comprising the steps of purging a plasma reactor containing a processed wafer with a plasma consisting of a noble gas, flowing a sufficient amount of an inert electronegative gas to neutralize the processed wafer into the plasma reactor in the absence of a plasma, and removing the processed wafer from the plasma reactor. The plasma of the noble gas preferably consists of helium and the electronegative gas preferably consists of oxygen or a mixture of helium and oxygen. The process is preferably conducted after a plasma enhanced deposition of a dielectric layer such as deposition of a silicon oxide layer from a reactive gas comprising TEOS, oxygen, and helium.

The present invention further provides a substrate processing system, comprising a plasma reactor comprising a reaction zone, a substrate holder for positioning a substrate in the reaction zone, and a vacuum system. The processing system further comprises a gas distribution system connecting the reaction zone of the vacuum chamber to supplies of a noble gas, preferably helium, and an inert electronegative gas such as oxygen or nitrogen, preferably oxygen, as well as process gases such as TEOS. An RF generator is coupled to the gas distribution system for generating a plasma in the reaction zone. The processing system further comprises a controller comprising a computer for controlling the plasma reactor, the gas distribution system, and the RF generator, and a memory coupled to the controller, the memory comprising a computer usable medium comprising a computer readable program code for selecting a process comprising the steps of purging the plasma reactor with a plasma consisting of the noble gas while a processed wafer is on the substrate holder, flowing a sufficient amount of an electronegative gas to neutralize the wafer into the plasma reactor in the absence of a plasma, and removing the processed wafer from the plasma reactor.

The processing system may further comprise in one embodiment computer readable program code for depositing a silicon oxide layer from a reactive gas comprising TEOS, oxygen, and helium.

Further description of the invention will be directed toward a specific embodiment.

Exemplary CVD Plasma Reactor

Figure 1:
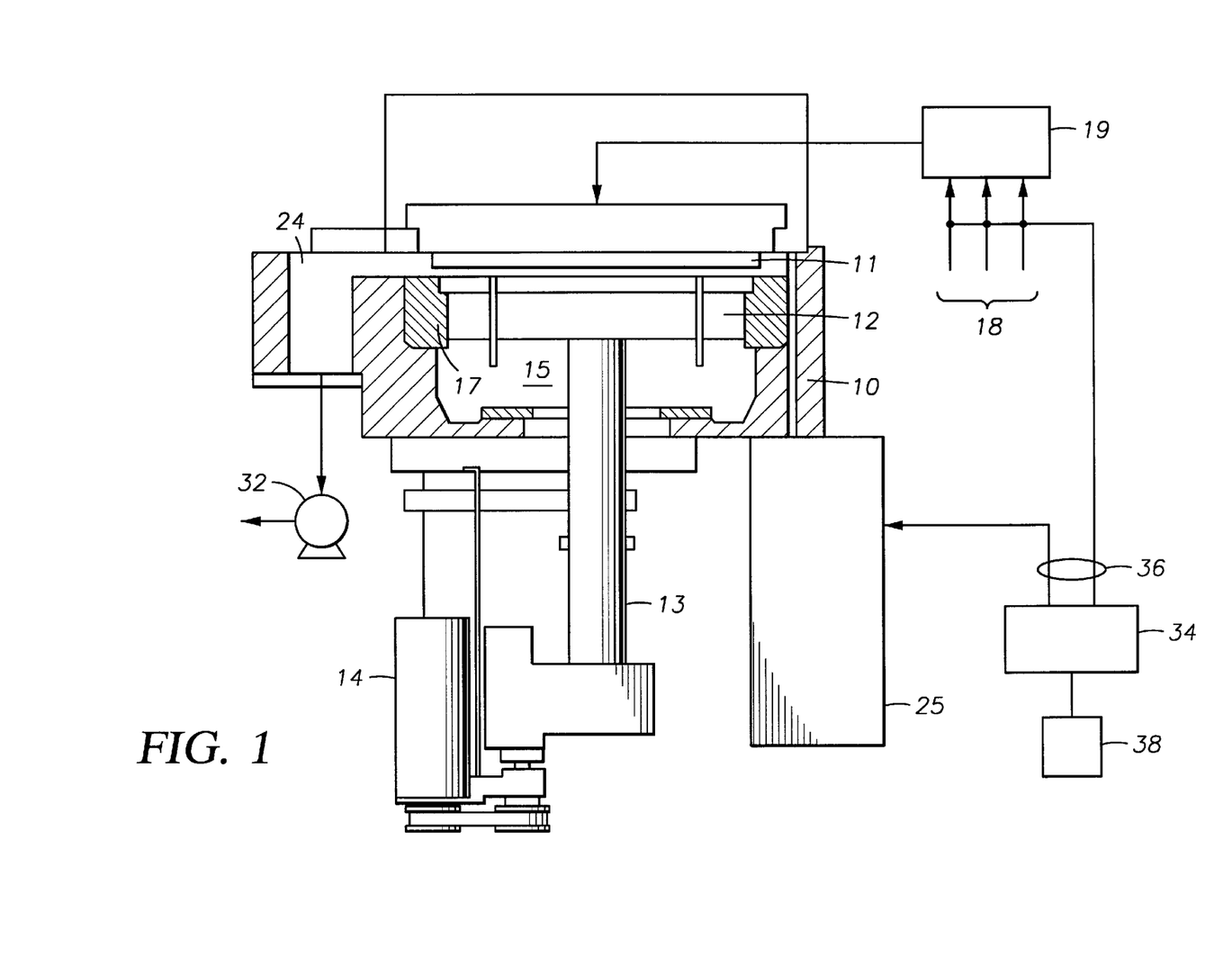
FIG. 1 is a cross-sectional diagram of an exemplary CVD plasma reactor used according to one embodiment of the present invention.

One suitable CVD plasma reactor in which a method of the present invention can be carried out is shown in FIG. 1, which is a vertical, cross-section view of a simplified, parallel plate chemical vapor deposition reactor 10 having a vacuum chamber 15. Reactor 10 contains a gas distribution manifold 11 for dispersing process gases through perforated holes in the manifold to a substrate or wafer (not shown) that rests on a substrate support plate or susceptor 12.

Susceptor 12 is resistivity heated and is mounted on a support stem 13 so that susceptor 12 and a wafer supported on the upper surface of susceptor 12 can be controllably moved by a lift motor 14 between a lower loading/off-loading position and an upper processing position which is closely adjacent to the manifold 11.

When susceptor 12 and the wafer are in the processing position, they are surrounded by an insulator ring 17. During processing, gases inlet to manifold 11 are uniformly distributed radially across the surface of the wafer. The gases exhaust through a port 24 by a vacuum pump system 32 having a throttle valve to control exhaust rate of gas from the chamber.

Before reaching manifold 11, deposition and carrier gases are input through gas lines 18 into a mixing system 19 where they are combined and then sent to manifold 11. Generally, the process gases supply lines 18 for each of the process gases include I) safety shut-off valves (not shown) that can be used to automatically or manually shut off the flow of process gas into the chamber, and ii) mass flow controllers (also not shown) that measure the flow of gas through the gas supply lines. When toxic gases are used in the process, several safety shut-off valves are positioned on each gas supply line in conventional configurations.

The deposition process performed in reactor 10 can be either a thermal process or a plasma enhanced process. In a plasma process, a controlled plasma is formed adjacent to the wafer by RF energy applied to distribution manifold 11 from RF power supply 25 (with susceptor 12 grounded). Gas distribution manifold 11 is also an RF electrode, while susceptor 12 is grounded. RF power supply 25 scan supply either single or mixed frequency RF power to manifold 11 to enhance the decomposition of reactive species introduced into chamber 15. A mixed frequency RF power supply typically supplies power at a high RF frequency (RF1) of 13.56 MHz and at a low RF frequency (RF2) of 350 KHz.

Heat is provided to the susceptor 12 by a resistive heat coil embedded in the susceptor 12. This additional heat compensates for the natural heat loss pattern of the susceptor and provides rapid and uniform susceptor and wafer heating for effecting deposition.

Typically, any or all of the chamber lining, gas inlet manifold faceplate, support stem 13, and various other reactor hardware is made out of material such as aluminum or aluminum oxide. An example of such a CVD reactor is described in U.S. Pat. No. 5,000,113, entitled "Thermal CVD/PECVD Reactor and Use for Thermal Chemical Vapor Deposition of Silicon Dioxide and Insitu Multi-step Planarized Process," issued to Wang et al. And assigned to Applied Materials, Inc., the assignee of the present invention.

The lift motor 14, the gas mixing system 19, and the RF power supply 25 are controlled by a system controller 34 over control lines 36. The reactor includes analog assemblies such as mass flow controllers (MFCs), RF generators, and lamp magnet drivers that are controlled by the system controller 34 which executes system control software stored in a memory 38, which in the preferred embodiment is a hard disk drive. Motors and optical sensors are used to move and determine the position of movable mechanical assemblies such as the throttle valve of the vacuum system 32 and motor for positioning the susceptor 12.

The system controller 34 controls all of the activities of the CVD reactor and a preferred embodiment of the controller 34 includes a hard disk drive, a floppy disk drive, and a card rack. The card rack contains a single board computer (SBC), analog and digital input/output boards, interface boards and stepper motor controller boards. The system controller conforms to the Versa Modular Europeans (VME) standard which defines board, card cage, and connector dimensions and types. The VME standard also defines the bus structure having a 16-bit data but and 24-bit address bus.

Figure 2:
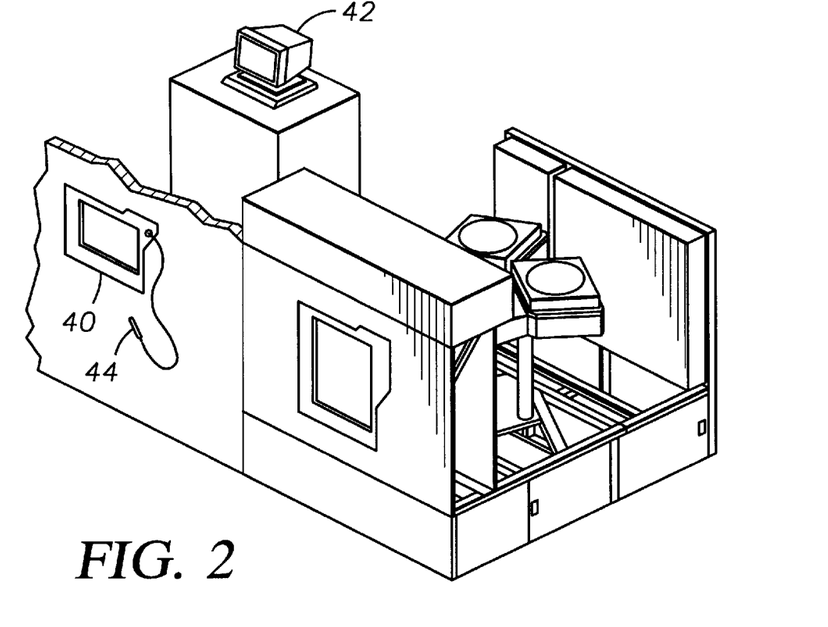
FIG. 2 is a diagram of the system monitor of the CVD plasma reactor of FIG. 1.

The system controller 34 operates under the control of a computer program stored on the hard disk drive 38. The computer program dictates the timing, mixture of gases, RF power levels, susceptor position, and other parameters of a particular process. The interface between a user and the system controller is via a CRT monitor 40 and light pen 44 which are depicted in FIG. 2. In the preferred embodiment a second monitor 42 is used, the first monitor 40 being mounted in the clean room wall for the operators and the other monitor 42 behind the wall for the service technicians. Both monitors 40, 42 simultaneously display the same information but only one light pen 44 is enabled. The light pen 44 detects light emitted by CRT display with a light sensor in the tip of the pen. To select a particular screen or function, the operator touches a designated area of the display screen and pushes the button on the pen 44. The touched area changes its highlighted color, or a new menu or screen is displayed, confirming communication between the light pen and the display screen.

The process can be implemented using a computer program product 410 that runs on, for example, the system controller 34. The computer program code can be written in any conventional computer readable programming language such as for example 68000 assembly language, C, C++, or Pascal. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled windows library routines. To execute the linked compiled object code, the system user invokes the object code, causing the computer system to load the code in memory, from which the CPU reads and executes the code to perform the tasks identified in the program.

Figure 3:
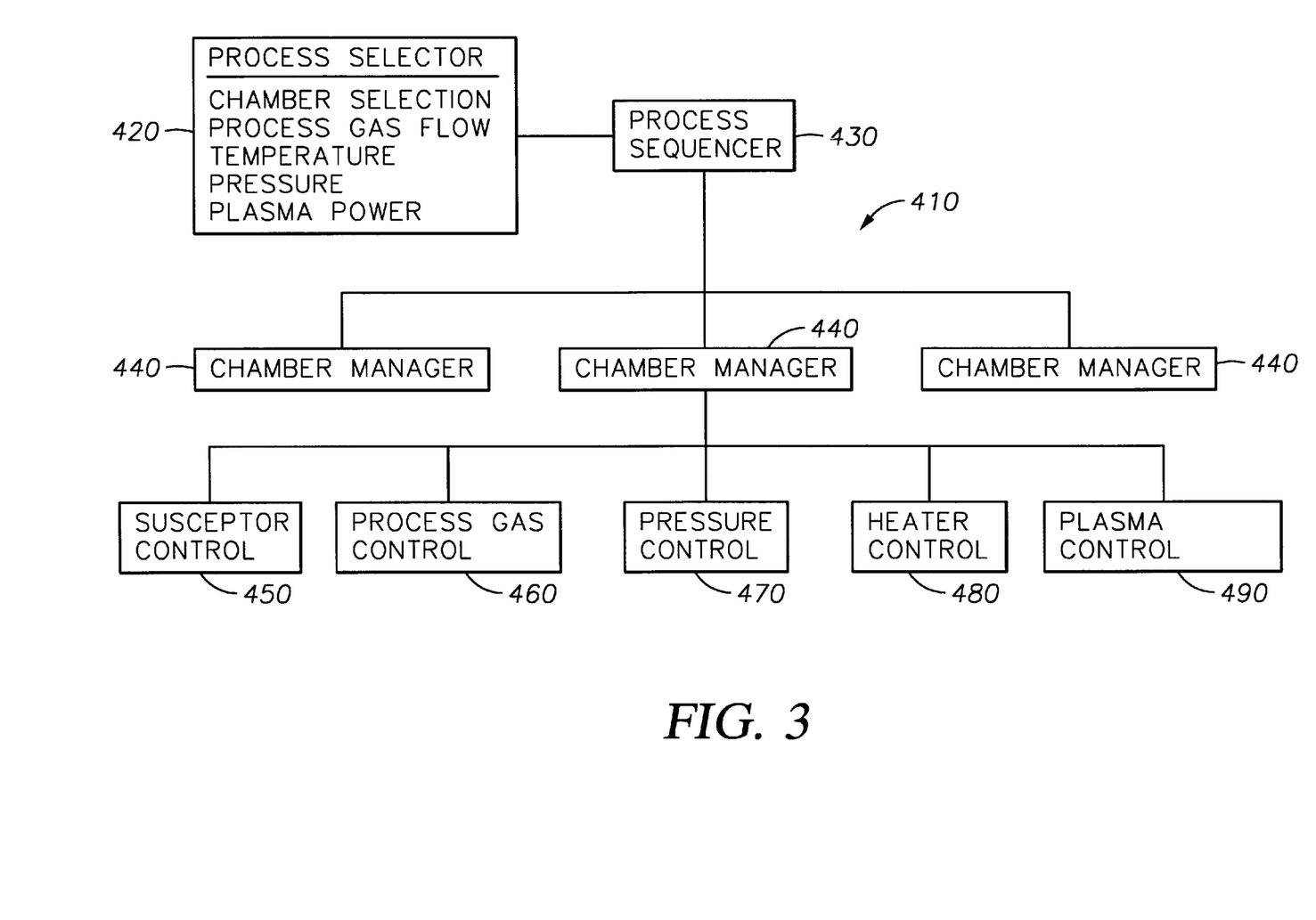
FIG. 3 is a flowchart of a process control computer program product used in conjunction with the exemplary CVD plasma reactor of FIG. 1.

FIG. 3 shows an illustrative block diagram of the hierarchical control structure of the computer program 410. A user enters a process set number and process chamber number into a process selector subroutine 420 in response to menus or screens displayed on the CRT monitor 40 by using the light pen 44 interface. The process sets are predetermined sets of process parameters necessary to carry out specified processes, and are identified by predefined set numbers. The process selector subroutine 420 identifies (I) the desired process chamber, and (ii) the desired set of process parameters needed to operate the process chamber for performing the desired process. The process parameters for performing a specific process relate to process conditions such as, for example, process gas composition and flow rates, temperature, pressure, plasma conditions such as RF bias power levels and magnetic field power levels, cooling gas pressure, and chamber wall temperature and are provided to the user in the form of a recipe. The parameters specified by the recipe are entered utilizing the light pen/CRT monitor interface.

The signals for monitoring the process are provided by the analog input and digital input boards of system controller and the signals for controlling the process are output on the analog output and digital output boards of the system controller 34.

A process sequencer subroutine 430 comprises program code for accepting the identified process chamber and set of process parameters from the process selector subroutine 420, and for controlling operation of the various process chambers. Multiple users can enter process set numbers and process chamber numbers, or a user can enter multiple process chamber numbers, so the sequencer subroutine 430 operates to schedule the selected processes in the desired sequence. Preferably the sequencer subroutine 430 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the sequencer subroutine 430 can be designed to take into consideration the present condition of the process chamber being used in comparison with the desired process conditions for a selected process, or the "age" of each particular user entered request, or any other relevant factor a system programmer desires to include for determining the scheduling priorities.

Once the sequencer subroutine 430 determines which process chamber and process set combination is going to be executed next, the sequencer subroutine 430 causes execution of the process set by passing the particular process set parameters to a chamber manager subroutine 440 which controls multiple processing tasks in a process chamber 15 according to the process set determined by the sequencer subroutine 430. For example, the chamber manager subroutine 440 comprises program code for controlling sputtering and CVD process operations in the process chamber 15. The chamber manager subroutine 440 also controls execution of various chamber component subroutines which control operation of the chamber component necessary to carry out the selected process set. Examples of chamber component subroutines are susceptor control subroutine 450, process gas control subroutine 460, pressure control subroutine 470, heater control subroutine 480, and plasma control subroutine 490. Those having ordinary skill in the art would readily recognize that other chamber control subroutines can be included depending on what processes are desired to be performed in the process chamber 15.

In operation, the chamber manager subroutine 440 selectively schedules or calls the process component subroutines in accordance with the particular process set being executed. The chamber manager subroutine 440 schedules the process component subroutines similarly to how the sequencer subroutine 430 schedules which process chamber 15 and process set is to be executed next. Typically, the chamber manager subroutine 440 includes steps of monitoring the various chamber components, determining which components needs to be operated based on the process parameters for the process set to be executed, and causing execution of a chamber component subroutine responsive to the monitoring and determining steps.

Operation of particular chamber components subroutines will now be described with reference to FIG. 3. The susceptor control positioning subroutine 450 comprises program code for controlling chamber components that are used to load the substrate onto the susceptor 12, and optionally to lift the substrate to a desired height in the chamber 15 to control the spacing between the substrate and the gas distribution manifold 11. When a substrate is loaded into the process chamber 15, the susceptor 12 is lowered to receive the substrate, and thereafter, the susceptor 12 is raised to the desired height in the chamber, to maintain the substrate at a first distance or spacing from the gas distribution manifold 11 during the CVD process. In operation, the susceptor control subroutine 450 controls movement of the susceptor 12 in response to process set parameters t that are transferred from the chamber manager subroutine 440.

The process gas control subroutine 460 has program code for controlling process gas composition and flow rates. The process gas control subroutine 460 controls the open/close position of the safety shut-off valves, and also ramps up/down the mass flow controllers to obtain the desired gas flow rate. The process gas control subroutine 460 is invoked by the chamber manager subroutine 440, as are all chamber components subroutines, and receives from the chamber manager subroutine process parameters related to the desired gas flow rates. Typically, the process gas control subroutine 460 operates by opening the gas supply lines, and repeatedly (i) reading the necessary mass flow controllers, (ii) comparing the readings to the desired flow rates received from the chamber manager subroutine 440, and (iii) adjusting the flow rates of the gas supply lines as necessary. Furthermore, the process gas control subroutine 460 includes steps for monitoring the gas flow rates for unsafe rates, and activating the safety shut-off valves when an unsafe condition is detected.

In some processes, an inert gas such as argon is flowed into the chamber 15 to stabilize the pressure in the chamber before reactive process gases are introduced into the chamber. For these processes, the process gas control subroutine 460 is programmed to include steps for flowing the inert gas into the chamber 15 for an amount of time necessary to stabilize the pressure in the chamber, and then the steps described above would be carried out. Additionally, when a process gas it to be vaporized from a liquid precursor, for example tetraethylorthosilicate (TEOS), the process gas control subroutine 460 would be written to include steps for vaporizing the liquid precursor in a delivery gas such as helium. For this type of process, the process gas control subroutine 460 regulates the flow of the delivery gas and the liquid precursor. As discussed above, the desired process gas flow rates are transferred to the process gas control subroutine 460 as process parameters. Furthermore, the process gas control subroutine 460 includes steps for obtaining the necessary delivery gas flow rate and liquid precursor flow rate by accessing a stored table containing the necessary values for a given process gas flow rate. Once the necessary values are obtained, the delivery gas flow rate and the precursor liquid flow rate are monitored, compared to the necessary values, and adjusted accordingly.

The pressure control subroutine 470 comprises program code for controlling the pressure in the chamber 15 by regulating the size of the opening of the throttle valve in the exhaust system 32 of the chamber. The size of the opening of the throttle valve is set to control the chamber pressure to the desired level in relation to the total process gas flow, size of the process chamber, and pumping set point pressure for the exhaust system 32. When the pressure control subroutine 470 is invoked, the desired, or target pressure level is received as a parameter from the chamber manager subroutine 440. The pressure control subroutine 470 operates to measure the pressure in the chamber 15 by reading one or more conventional pressure manometers connected to the chamber, compare the measure value(s) to the target pressure, obtain PID (proportional, integral, and differential) values from a stored pressure table corresponding to the target pressure, and adjust the throttle valve according to the PID values obtained from the pressure table. Alternatively, the pressure control subroutine 470 can be written to open or close the throttle valve to a particular opening size to regulate the chamber 15 to the desired pressure.

The heater control subroutine 480 comprises program code for controlling the temperature of the resistive heat coil that is used to heat the susceptor 12. The heater control subroutine 480 is also invoked by the chamber manager subroutine 440 and receives a target, or set point, temperature parameter. The heater control subroutine 480 measures the temperature by measuring voltage output of a thermocouple located in a susceptor 12, compares the measured temperature to the set point temperature, and increases or decreases current applied to the heat coil in the susceptor 12 to obtain the set point temperature. The temperature is obtained from the measured voltage by looking up the corresponding temperature in a stored conversion table, or by calculating the temperature using a fourth order polynomial. The heater control subroutine 480 gradually controls a ramp up/down of current applied to the resistive heat module 26. The gradual ramp up/down increases the life and reliability of the heat coil in the susceptor 12. Additionally, a built-in-fail-safe mode can be included to detect process safety compliance, and can shut down operation of the heat coil if the process chamber 15 is not properly set up.

The plasma control subroutine 490 comprises program code for setting the RF bias voltage power level applied to the process electrodes in the chamber 15, and optionally, to set the level of the magnetic field generated in the chamber. Similar to the previously described chamber component subroutines, the plasma control subroutine 490 is invoked by the chamber manager subroutine 440.

The above CVD system description is mainly for illustrative purposes, and other plasma CVD equipment such as electrode cyclotron resonance (ECR) plasma CVD devices, inductioncoupled RF high density plasma CVD devices, or the like may be employed. Additionally, variations of the above described system such as variations in susceptor design, heater design, location of RF power connections and others are possible. For example, the wafer could be heated by a UV lamp. The method for removing a wafer of the present invention is not limited to any specific apparatus or to any specific plasma excitation method.

Wafer Neutralization After PECVD Deposition of a Silicon Oxide Film

Figure 4:
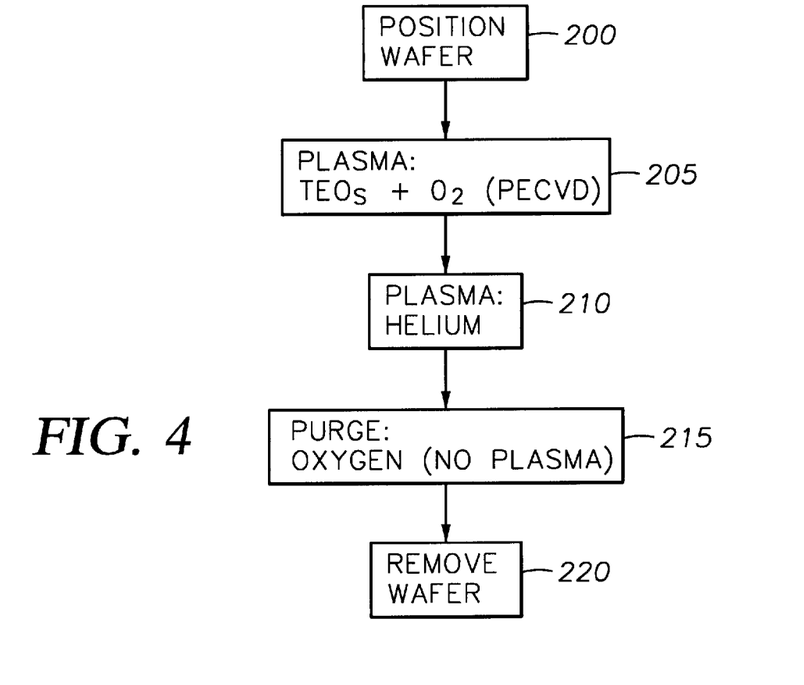
FIG. 4 is a flow chart illustrating steps undertaken in a preferred embodiment ofthe invention.

The present wafer neutralization process may be employed to replace an oxygen plasma process currently used to remove wafers from a plasma reactor after PECVD deposition of a silicon oxide layer in a plasma reactor such as in chamber 15 in the exemplary CVD plasma reactor 10 described above. FIG. 4 illustrates a preferred process of the invention for removing the wafer from the plasma reactor 10. This process is implemented and controlled using a computer program stored in the memory 38 of a computer controller 34 for the CVD plasma reactor 10.

Referring to FIG. 4, a wafer is positioned 200 in the plasma reactor 10 and a silicon oxide layer is deposited 205 by a PECVD process from a plasma comprising TEOS and oxygen. The deposition step 205 can include a capacitively coupled plasma or both an inductively and a capacitively coupled plasma in the process chamber 15 according to methods known in the art. An inert gas such as helium is commonly used in the PECVD deposition. After the deposition is completed, a negative charge remains on the wafer. Energizing the plasma reactor 10 is accomplished by purging 210 the reactor 10 with a plasma consisting of a noble gas, preferably helium, according to methods known in the art. A neutralizing purge step 215 is then conducted in the absence of a plasma by flowing a sufficient amount of an inert electronegative gas, preferably oxygen alone or in combination with helium, into the process chamber 15 to neutralize the wafer. The wafer can then be safely removed 220 from the plasma reactor 10.

The PECVD layer is deposited with a process gas that includes a mixture of TEOS and oxygen which are introduced into chamber 15 via gas lines 18 and mixing system 19. The liquid TEOS is vaporized and mixed with an inert carrier gas, such as helium, and is flowed at a net rate of about 400–1500 sccm and preferably at a net flow rate of about 800 sccm. These flow rates are given for a chamber having a volume of approximately 5.5 to 6.5 liters. The $O_2$ is flowed into the chamber 15 at a rate of about 400–1500 sccm and preferably at a rate of approximately 600 sccm. Chamber 15 is brought to a pressure of about 1–20 torr. Preferably, chamber 15 is maintained at a pressure of about 2–5 torr during deposition of the PECVD layer.

A plasma is formed from this process gas by the application of mixed frequency RF power from RF power supply 25, resulting in the deposition of the PECVD layer (step 205).

The invention is further described by the following example of a neutralization method which can be used prior to removing a wafer from a plasma reactor.

EXAMPLE

The following example demonstrates the present invention by describing a successful neutralization of a plasma reactor. This example was undertaken using a chemical vapor deposition chamber, and in particular, a "CENTURA DxZ" plasma reactor fabricated and sold by Applied Materials, Inc., Santa Clara, Calif.

A silicon wafer was positioned on a susceptor in the plasma reactor and the wafer was charged during a deposition process. After deposition, the separation between the wafer and the gas distribution manifold was adjusted to 650 mil and helium flow continued at 2000 sccm at a reactor pressure of 1.6 Torr in the absence of other gas flows. High frequency RF power (13.5 MHz) was applied at 100 W to maintain a helium plasma for 3 seconds. The RF power and helium flow were then discontinued and oxygen was introduced at 2000 sccm for 5 seconds in the absence of other gas flows. The wafer was then easily lifted from the susceptor.

While the foregoing is directed to the preferred embodiment of the present invention, other and further embodiments of the invention may be devised without departing from the basic scope thereof, and the scope thereof is determined by the claims which follow.

What is claimed is:

1. A method for processing a wafer having a negative charge resulting from a deposition process performed on the wafer, comprising the sequential steps of:

providing a plasma consisting of a noble gas within a chamber containing the wafer, wherein the noble gas consists of helium;

neutralizing the negative charge on the wafer by flowing an electronegative gas into the chamber in the absence of plasma power, wherein the electronegative gas consists of a gas selected from the group consisting of oxygen and a mixture of oxygen and helium; and removing the wafer from the chamber.

2. The method of claim 1, wherein the noble gas consists of helium and the electronegative gas consists of a gas selected from the group consisting of oxygen and a mixture of oxygen and helium.

3. A method for processing a wafer in a chamber, comprising the sequential steps of:

positioning the wafer on a wafer support member in the chamber;

providing a negative charge on the wafer utilizing a plasma deposition process;

providing a plasma consisting of a noble gas within the chamber, wherein the noble gas consists of helium;

neutralizing the negative charge on the wafer by flowing an electronegative gas into the chamber in the absence of plasma power, wherein the electronegative gas consists of a gas selected from the group consisting of oxygen and a mixture of oxygen and helium; and lifting the wafer off the wafer support member.

4. The method of claim 3, wherein the noble gas plasma is maintained for about 3 seconds and the electronegative gas is flowed for about 5 seconds.

5. The method of claim 4, wherein the noble gas consists of helium and the electronegative gas cosists of a gas selected from the group consisting of oxygen and a mixture of oxygen and helium.

6. The method of claim 5, wherein the noble gas plasma is maintained for about 3 seconds and the electronegative gas is flowed for about 5 seconds.

7. The method of claim 5, wherein the reactive gas comprises tetraethylorthosilicate (TEOS) and oxygen.

8. The method of claim 7, wherein the reaction of TEOS and oxygen is plasma enhanced.

9. The method of claim 8, wherein the noble gas plasma is maintained for about 3 seconds and the electronegative gas is flowed for about 5 seconds.

10. A method of removing a negatively charged wafer from a chamber, comprising:

a) neutralizing the negatively charged wafer, the neutralizing step comprising:

i) flowing a noble gas into the chamber;

ii) applying power to excite the noble gas to a plasma state;

iii) terminating noble gas flow and power application; and iv) flowing an electronegative gas into the chamber, wherein the electronegative gas comprises a gas selected from the group consisting of oxygen and a gas mixture of oxygen and helium;

b) removing the wafer from a wafer support member; and c) removing the wafer from the chamber.

11. The method of claim 10, wherein the noble gas plasma is maintained for about 3 seconds and the electronegative gas is flowed for about 5 seconds.

* * * * *

UNITED STATES PATENT AND TRADEMARK OFFICE
CERTIFICATE OF CORRECTION

PATENT NO. : 6,083,569
DATED : July 4, 2000
INVENTOR(S) : Gupta, et al.

It is certified that error appears in the above-identified patent and that said Letters Patent is hereby corrected as shown below:

Column 9,
Lines 2-5, please delete "wherein the noble gas consists of helium and the electronegative gas consists of a gas selected from the group consisting of oxygen and a mixture of oxygen and helium", and insert therefor -- wherein the noble gas plasma is maintained for about 3 seconds and the electronegative gas is flowed for about 5 seconds --.
Lines 24-27, please delete "The method of claim 4, wherein the noble gas consists of helium and the electronegative gas consists of a gas selected from the group consisting of oxygen and a mixture of oxygen and helium", and insert therefor -- A method for processing a wafer in a chamber, comprising the sequential steps of:
positioning the wafer in the chamber;
depositing a dielectric layer on the wafer using a first plasma comprising reactive gases;
providing a second plasma consisting of a noble gas within the chamber, wherein the noble gas consists of helium;
neutralizing a negative charge on the wafer by flowing an electronegative gas into the chamber in the absence of plasma power, wherein the electronegative gas consists of a gas selected from the group consisting of oxygen and a mixture of oxygen and helium; and removing the wafer from the chamber --.

UNITED STATES PATENT AND TRADEMARK OFFICE
CERTIFICATE OF CORRECTION

PATENT NO. : 6,083,569
DATED : July 4, 2000
INVENTOR(S) : Gupta, et al.

It is certified that error appears in the above-identified patent and that said Letters Patent is hereby corrected as shown below:

Column 10,
Lines 3-4, please delete "The method of claim 7, wherein the reaction of TEOS and oxygen is plasma enhanced", and insert therefor -- A method for removing a negative charge on a wafer disposed in a chamber prior to removal of the wafer from the chamber, comprising the sequential steps of:
providing a noble gas to the chamber, wherein the noble gas consists of helium;
applying power to the gas to form a plasma;
stopping the power applied to form the plasma; and
neutralizing the negative charge on the wafer by providing an electronegative gas into the chamber, wherein the electronegative gas consists of a gas selected from the group consisting of oxygen and a mixture of oxygen and helium --.

Signed and Sealed this

Twenty-first Day of August, 2001

Attest:

*Nicholas P. Godici*

NICHOLAS P. GODICI
*Attesting Officer*    *Acting Director of the United States Patent and Trademark Office*